United States Patent
Lee et al.

(10) Patent No.: US 9,553,552 B2
(45) Date of Patent: Jan. 24, 2017

(54) DIVERSITY AMP MODULE AND APPARATUS COMPRISING THE SAME

(71) Applicant: Samsung Electronics Co., Ltd., Gyeonggi-do (KR)

(72) Inventors: Jae Hoon Lee, Gyeonggi-do (KR); Ho Soo Seo, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/800,841

(22) Filed: Jul. 16, 2015

(65) Prior Publication Data

US 2016/0020738 A1 Jan. 21, 2016

(30) Foreign Application Priority Data

Jul. 16, 2014 (KR) .................. 10-2014-0089433

(51) Int. Cl.
| | |
|---|---|
| *H03F 3/217* | (2006.01) |
| *H04B 1/00* | (2006.01) |
| *H04B 1/18* | (2006.01) |
| *H03F 3/19* | (2006.01) |
| *H03F 3/21* | (2006.01) |
| *H04B 1/40* | (2015.01) |
| *H04B 7/04* | (2006.01) |

(52) U.S. Cl.
CPC ............... *H03F 3/217* (2013.01); *H03F 3/19* (2013.01); *H03F 3/211* (2013.01); *H04B 1/006* (2013.01); *H04B 1/18* (2013.01); *H04B 1/40* (2013.01); *H04B 7/0413* (2013.01); *H03F 2200/294* (2013.01); *H03F 2200/451* (2013.01); *H03F 2203/21109* (2013.01); *H03F 2203/21112* (2013.01)

(58) Field of Classification Search
CPC ............ H03F 3/217; H03F 3/19; H03F 3/211; H04B 1/40; H04B 7/0413; H04B 1/50
USPC .......................................... 455/78
See application file for complete search history.

(56) References Cited

U.S. PATENT DOCUMENTS

| | | | | |
|---|---|---|---|---|
| 5,835,853 | A * | 11/1998 | Enoki ............... | H03D 7/161 455/180.1 |
| 7,142,829 | B2 * | 11/2006 | Sung ................. | H04B 7/0608 375/299 |
| 7,643,848 | B2 * | 1/2010 | Robinett .......... | H04B 1/006 455/103 |
| 8,090,060 | B2 * | 1/2012 | Brannstrom ..... | H04B 7/0848 375/330 |
| 8,634,782 | B2 * | 1/2014 | Asuri ............... | H04B 1/0064 455/101 |

(Continued)

FOREIGN PATENT DOCUMENTS

EP 0 784 381 A2 7/1997

*Primary Examiner* — Hai V Nguyen
(74) *Attorney, Agent, or Firm* — Cha & Reiter, LLC

(57) ABSTRACT

An amplifying module having one input terminal and one output terminal and passing an antenna signal input through the input terminal towards the output terminal. The amplifying module includes a first switch connected to the input terminal, a plurality of filters selectable by the first switch, a plurality of amplifiers respectively connected to the plurality of filters and amplifying a signal that has passed through the filters, and a second switch for connecting the amplified signal to the output terminal.

17 Claims, 5 Drawing Sheets

(56) References Cited

U.S. PATENT DOCUMENTS

| | | | |
|---|---|---|---|
| 8,670,797 B2* | 3/2014 | Asuri | H04B 1/0064 455/127.4 |
| 8,676,134 B2* | 3/2014 | Mele | H04B 1/18 455/424 |
| RE45,273 E* | 12/2014 | Robinett | H04B 1/006 455/103 |
| 9,002,309 B2 | 4/2015 | Sahota et al. | |
| 9,026,070 B2* | 5/2015 | Persico | H04B 1/109 375/247 |
| 9,154,179 B2* | 10/2015 | Gudem | H04B 1/109 |
| 9,154,357 B2* | 10/2015 | Tasic | H03G 3/20 |
| 9,160,598 B2* | 10/2015 | Davierwalla | H03G 3/20 |
| 9,300,420 B2* | 3/2016 | Chang | H04B 1/0064 |
| 9,392,547 B2* | 7/2016 | Hong | H04B 7/0871 |
| 2005/0143024 A1* | 6/2005 | Sung | H04B 7/0608 455/101 |
| 2007/0268980 A1* | 11/2007 | Brannstrom | H04B 7/0848 375/265 |
| 2010/0020907 A1* | 1/2010 | Rezvani | H04B 7/0848 375/347 |
| 2010/0202325 A1* | 8/2010 | Poulin | H04L 27/0002 370/280 |
| 2012/0057621 A1* | 3/2012 | Hong | H04W 52/0264 375/219 |
| 2012/0171968 A1 | 7/2012 | Poulin et al. | |
| 2012/0302188 A1* | 11/2012 | Sahota | H04B 1/006 455/150.1 |
| 2013/0043946 A1* | 2/2013 | Hadjichristos | H04B 1/0057 330/252 |
| 2013/0084915 A1* | 4/2013 | Asuri | H04B 1/0064 455/552.1 |
| 2013/0095895 A1* | 4/2013 | Asuri | H04B 1/0064 455/571 |
| 2013/0188529 A1* | 7/2013 | Poulin | H04L 27/0002 370/278 |
| 2013/0195151 A1* | 8/2013 | Miller | H04B 1/006 375/219 |
| 2014/0269853 A1* | 9/2014 | Gudem | H04L 5/0098 375/219 |
| 2015/0200690 A1* | 7/2015 | Youssef | H04B 1/006 455/73 |
| 2015/0249479 A1* | 9/2015 | Nobbe | H04B 17/12 455/77 |
| 2015/0304000 A1* | 10/2015 | Wloczysiak | H04B 1/006 455/78 |

\* cited by examiner

DIVERSITY AMP MODULE AND APPARATUS COMPRISING THE SAME

CLAIM OF PRIORITY

This application claims the benefit under 35 U.S.C. §119 (a) from a Korean patent application filed on Jul. 16, 2014 in the Korean Intellectual Property Office and assigned Serial number 10-2014-0089433, the entire disclosure of which is hereby incorporated by reference in its entirety.

BACKGROUND

Field of the Invention

The present disclosure relates to a technology for amplifying a signal received from an antenna and transmitting the amplified signal to a front end module (FEM), or a transceiver, through a single path.

Description of the Related Art

Data throughput of an electronic device to which Long Term Evolution (LTE) technology is applied (e.g., Galaxy S5, Galaxy Note 3, or the like) may be maximized using multiple input-multiple output (MIMO) technology. In particular, a performance requirement in terms of total radiated sensitivity (TRS) should be satisfied so that the electronic device may perform communication based on the MIMO while maintaining high data throughput.

In general, electronic devices that support LTE communication typically may include one transmission antenna (TX ANT) and two receiving antennas (RX ANT). The two receiving antennas may be classified into a main RX ANT and a sub RX ANT. Here, the sub RX ANT may operate as a diversity antenna, and an electronic device may achieve maximum data throughput by virtue of the signals received through the individual RX paths.

A low-noise amplifier (LNA) is typically used to improve receiving sensitivity or performance of a diversity antenna. However, there is difficulty in obtaining optimum performance of an antenna using an optimized LNA component because a radio frequency integrated circuit (RFIC) such as a transceiver has various structures depending on manufacturers or products and a band to be supported by an electronic device is various.

Furthermore, in the case where an electronic device supports multiple LTE bands, a wiring may be disposed on a printed circuit board (PCB) in order to transfer a signal of each frequency band from an antenna (radiator) to a transceiver. This wiring may have a long path according to positions of the antenna and the transceiver. Since various components and wirings should be arranged on the PCB, there is difficulty and it is complicated to design the PCB on which long multiple paths corresponding to multiple bands are arranged.

SUMMARY

Accordingly, an aspect of the present disclosure is to provide an amplifying module which is not dependent on a manufacturer, or dependent on types of a transceiver or a front end module (FEM). The present disclosure enables connection of an antenna to an FEM through a single path while ensuring signal performance, and a device including the amplifying module.

In accordance with an aspect of the present disclosure, an amplifying module having one input terminal and one output terminal and passing an antenna signal input through the input terminal towards the output terminal is provided. The amplifying module includes a first switch connected to the input terminal, a plurality of filters selectable by the first switch, a plurality of amplifiers respectively connected to the plurality of filters and which amplify a signal that has passed through the filters, and a second switch for connecting the amplified signal to the output terminal.

DETAILED DESCRIPTION

Figure 1:
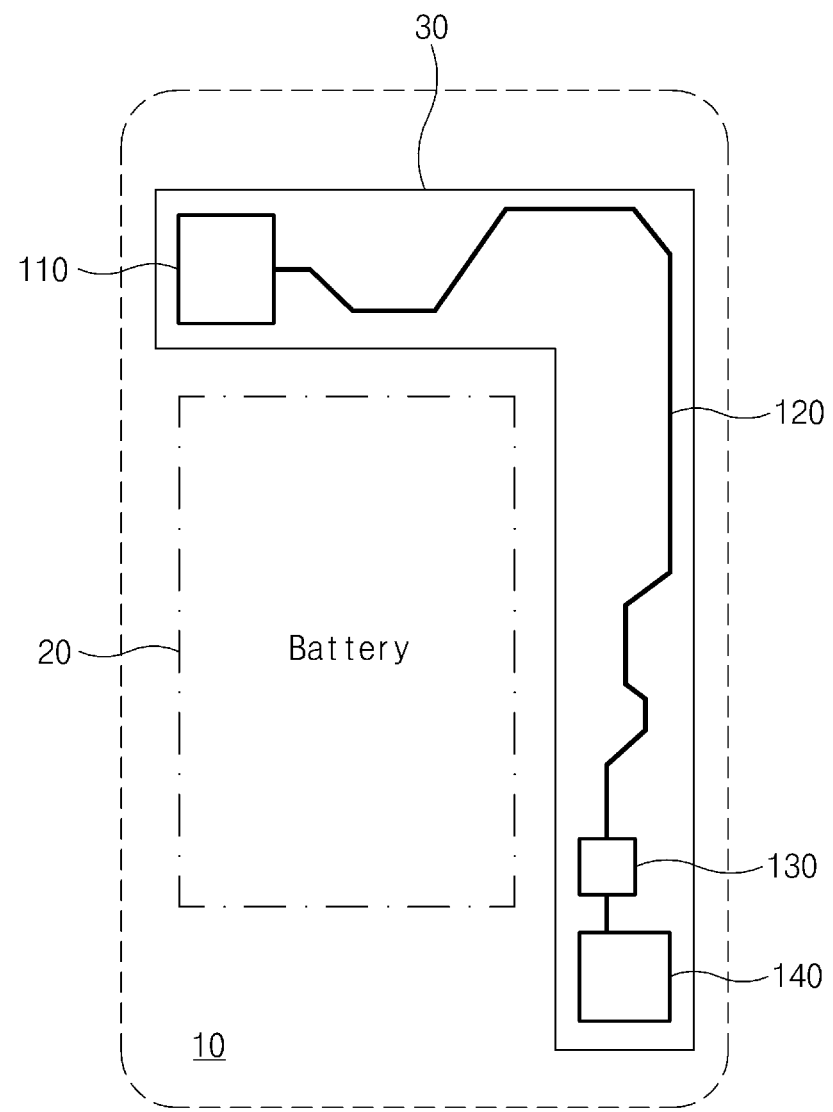
FIG. 1 is a conceptual diagram illustrating an electronic device including an amplifying module according to various embodiments of the present disclosure.

Hereinafter, various embodiments of the present disclosure will be described with reference to the accompanying drawings.

A person of ordinary skill in the art will understand and appreciate that the present disclosure may be modified in various ways and may include various embodiments. However, specific embodiments are provided for illustrative purposes, and are exemplarily illustrated in the drawings and detailed descriptions related thereto are provided. However, the person of ordinary skill in the art should understand that various embodiments of the present disclosure are not limited to specific examples but rather include all modifications, equivalents and alternatives that fall within the purview of various embodiments of the present disclosure. Regarding the drawings, like reference numerals refer to like elements.

The terms "include," "comprise," "including," or "comprising" used herein indicates disclosed functions, operations, or existence of elements but does not exclude other functions, operations or elements. It should be further understood that the term "include", "including", "comprise", "comprising", "have", or "having" used herein specifies the presence of stated features, numbers, operations, elements, components, or combinations thereof but does not preclude the presence or addition of one or more other features, numbers, operations, elements, components, or combinations thereof. The meaning of the term "or" or "at least one of A and/or B" used herein includes any and all combinations of words listed together with the term. For example, the wording "A or B" or "at least one of A and/or B" may indicate A, B, or both A and B.

The terms such as "first", "second", and the like used herein may refer to various elements of various embodiments of the present disclosure, but do not limit the elements. For example, such terms do not limit the order and/or priority of the elements. Furthermore, such terms may be used to distinguish one element from another element. For example, a first user device and a second user device indicate different user devices and do not limit the order. For example, without departing from the scope of the present disclosure, a first element may be named as a second element, and similarly, a second element may be named as a first element.

It will be understood that when an element is referred to as being "connected" or "coupled" to another element, it can be directly connected or coupled to the other element or intervening elements may be present. In contrast, when an element is referred to as being "directly connected" or "directly coupled" to another element, it should be understood that there are no intervening elements.

The terminology used herein is not for delimiting the present disclosure but for describing specific various embodiments of the present disclosure. The terms of a singular form may include plural forms unless otherwise specified.

The terms used herein, including technical and/or scientific terms, have the same meanings as understood by those skilled in the art, unless otherwise defined herein. The commonly used terms such as those defined in a dictionary should be interpreted in the same context as in the related art and should not be interpreted in an idealized or overly formal manner unless otherwise defined explicitly.

Electronic devices according to various embodiments of the present disclosure may include an antenna, particularly. For example, the electronic devices may include at least one of smartphones, tablet personal computers (PCs), mobile phones, video telephones, electronic book readers, desktop PCs, laptop PCs, netbook computers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (e.g., head-mounted-devices (HMDs) such as electronic glasses, an electronic apparel, electronic bracelets, electronic necklaces, electronic appcessories, electronic tattoos, or smart watches), just to name some non-limiting possibilities.

According to various embodiments of the present disclosure, the electronic devices may be smart home appliances including an antenna. The smart home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™ Apple TV™, or Google TV™), game consoles, electronic dictionaries, electronic keys, camcorders, or electronic picture frames.

According to various embodiments of the present disclosure, the electronic devices may include, for example, at least one of medical devices (e.g., a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for ships (e.g., navigation systems and gyrocompasses), avionics, security devices, head units for vehicles, industrial or home robots, automatic teller's machines (ATMs), or points of sales (POSs) including an antenna.

According to various embodiments of the present disclosure, the electronic devices may include, for example, at least one of parts of furniture or buildings/structures, electronic boards, electronic signature receiving devices, projectors, or measuring instruments (e.g., water meters, electricity meters, gas meters, or wave meters) including an antenna. The electronic devices according to various embodiments of the present disclosure may be one or more combinations of the above-mentioned devices. Furthermore, the electronic devices according to various embodiments of the present disclosure may be flexible devices. It would be obvious to those skilled in the art that the electronic devices according to various embodiments of the present disclosure are not limited to the above-mentioned devices.

An amplifying module described herein is differentiated from an amplifier (AMP). In more detail, the amplifying module may include an amplifier such as a low noise amplifier (LNA). In various embodiments of the present disclosure, the amplifying module has a structure in which a switch, a filter, an amplifier, and a switch are sequentially connected. Furthermore, the amplifying module has one input terminal and one output terminal, wherein the input terminal may be connected to an antenna and the output terminal may be connected to a front end module (FEM) through a wiring. The amplifying module proposed herein is particularly useful for amplification of a diversity antenna, and may be referred to as a diversity LNA module (DLM). However, in various embodiments of the present disclosure, the amplifying module is not limited in use to a diversity antenna, and may be applied to a typical antenna.

Hereinafter, electronic devices according to various embodiments of the present disclosure will be described with reference to the accompanying drawings. The term "user" as used herein may refer to a person who operates an electronic device or may refer to a device (e.g., an artificial electronic device) that operates the electronic device.

FIG. 1 is a conceptual diagram illustrating an electronic device including an amplifying module according to various embodiments of the present disclosure.

Referring now to FIG. 1, a printed circuit board (PCB) 30 may be mounted in an electronic device 10. The PCB 30 may be disposed outside an area occupied by a battery 20 in consideration of a heating issue or the like. FIG. 1 illustrates that the PCB 30 is bent in the shape of an inverted "L", but the shape of the PCB 30 is not limited thereto. In various embodiments of the present disclosure, the PCB 30 may have various shapes. For example, the PCB 30 may be disposed only at an area above the battery 20. (In this case, the battery 20 may extend rightwards.)

A plurality of PCBs 30 may be arranged in the electronic device 10. For example, in addition to the PCB 30 shown in FIG. 1, another PCB (not shown) may be disposed under the battery 20. Furthermore, a flexible PCB (FPCB) may be disposed at various areas in the electronic device 10. A plurality of PCBs (including an FPCB) arranged in the electronic device 10 may be connected to each other through a cable or the like.

An amplifying module 110, a front end module (FEM) 130, and an RFIC 140 may be arranged on the PCB 30. The PCB 30 may have a laminated structure in which multiple layers are stacked, wherein a portion or all of the amplifying module 110, the FEM 130, and the RFIC 140 may be arranged at appropriate layers.

The amplifying module 110 and the FEM 130 may be connected to the FEM 130 and the RFIC 140 respectively through a wiring structure disposed at the PCB 30. In various embodiments of the present disclosure, the FEM 130 may be connected to the RFIC 140 through a plurality of wiring structures according to respective structures of the FEM 130 and the RFIC 140. However, the amplifying module 110 may be connected to the FEM 130 through one wiring structure of a wiring 120. This configuration will be described in detail in relation to a structure of the amplifying module 110 with reference to FIG. 2.

The PCB 30 may provide feeding and a ground to an antenna (not shown). A signal received through the antenna may be input to the amplifying module 110. The signal that has passed through the amplifying module 110 may be transferred to the FEM 130 through the single wiring 120, and may be transferred to the RFIC 140 after undergoing appropriate signal processing, such as filtering in the FEM 130.

Figure 2:
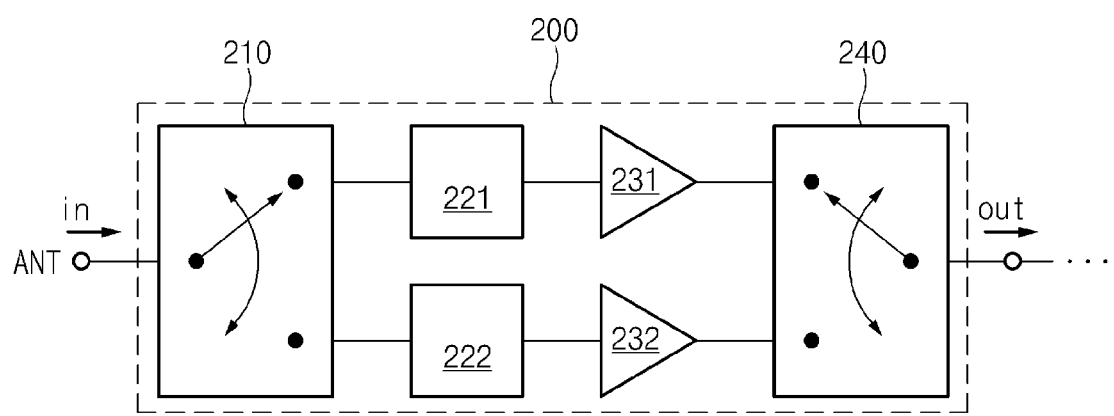
FIG. 2 illustrates an amplifying module according to various embodiments of the present disclosure.

FIG. 2 illustrates an amplifying module according to various embodiments of the present disclosure.

Referring now to FIG. 2, an amplifying module 200 may correspond to the amplifying module 110 illustrated in FIG. 1. The amplifying module 200 may include a first switch 210, filters 221 and 222, amplifiers 231 and 232, and a second switch 240.

For convenience, it is assumed that the amplifying module 200 of FIG. 2 processes signals of two frequency bands, but an artisan appreciates there can be many more frequency bands than two. For example, an electronic device including the amplifying module 220 of FIG. 2 may perform communication using signals of frequency bands corresponding to two LTE bands (e.g., B7, B20). A more general example of an amplifying module will be described later with reference to FIG. 3.

Referring again to FIG. 2, the first switch 210 may select an appropriate filter from among the filters 221 and 222. A signal received by the antenna may be introduced to a filter selected by the first switch 210. The filters 221 and 222 may be band pass filters (BPFs) that pass signals of an appropriate frequency band. For example, the filter 221 may pass signals of LTE B7 (about 2600 MHz), and the filter 222 may pass signals of LTE B20 (about 800 MHz). That is, a signal of a specified frequency band may be allowed to pass through a filter selected by the first switch 210 so as to be selected from among the signals received by the antenna.

A signal that has passed through one of the filters 221 and 222 may be amplified by a respective amplifier 231 or 232. For example, a signal that has passed through the filter 221 may be amplified by the amplifier 231, and a signal that has passed through the filter 222 may be amplified by the amplifier 232. In various embodiments of the present disclosure, an amplifier (e.g., the amplifiers 231 and 232) may be an LNA.

A signal amplified by the amplifier may be transferred to an output terminal through the second switch 240. In various embodiments of the present disclosure, the first switch 210 and the second switch 240 may interwork with each other. For example, in the case where the first switch 210 selects the filter 221, the second switch 240 may be connected to the amplifier 231. For example, in the case where the first switch 210 selects a specific BPF so that a signal of a specified band (e.g., B7) is obtained, the second switch 240 may select an LNA connected to the BPF.

The amplifying module 200 illustrated in FIG. 2 also has the following advantages. In a structure having a connection of ANT-FEM-RFIC, the FEM is disposed adjacent to an antenna in order to minimize the loss of a signal. (For example, the FEM is positioned on a location corresponding to the amplifying module 110). In the case where the antenna is utilized for receiving signals of a plurality of bands, the FEM performs frequency band selection and signal amplification using a plurality of BPFs and a plurality of LNAs corresponding to the bands respectively, and an amplified signal is transferred from the FEM to the RFIC through a plurality of wirings on a PCB. On the contrary, the amplifying module 220 of FIG. 2 may amplify a signal of a specified frequency band, and may transfer an amplified signal to an FEM (e.g., the FEM 130 of FIG. 1) through a single path. In other words, in a structure having a connection of ANT-DLM-FEM-RFIC according to various embodiments of the present disclosure, instead of a plurality of long wires, a single wire (e.g., the wiring 120) passes through a PCB, so that the PCB may be designed with ease while the performance of an antenna is ensured. In the structure having the connection of ANT-DLM-FEM-RFIC according to various embodiments of the present disclosure, a plurality of wirings may be present only at a portion between the FEM and the RFIC, and, as illustrated in FIG. 1, since the FEM 130 may be disposed adjacent to the RFIC 140 due to the presence of the amplifying module 110, an area of a PCB where a plurality of wirings are arranged may be efficiently reduced.

Furthermore, because of other various factors, such as a frequency band supported by an electronic device, components mounted in the electronic device, locations thereof, and a size or a shape of a PCB, sensitivity effect of the RF design, an FEM may be required to be modified in order to obtain satisfactory signal sensitivity/antenna performance whenever the type or specification of the electronic device is changed. However, if a signal of a specified band is provided through a single wiring using the structure of the amplifying module 200 of FIG. 2, an existing FEM may be still used, or a general-purpose FEM designed to support a specific band may be used. For example, in the case where the amplifying module 200 filters and amplifies signals of bands of B3 and B20 and outputs filtered and amplified signals, the output signals may be received using an FEM that supports processing of signals of bands of B3 and B7. A structure of a more general amplifying module is described below with reference to FIG. 3.

Figure 3:
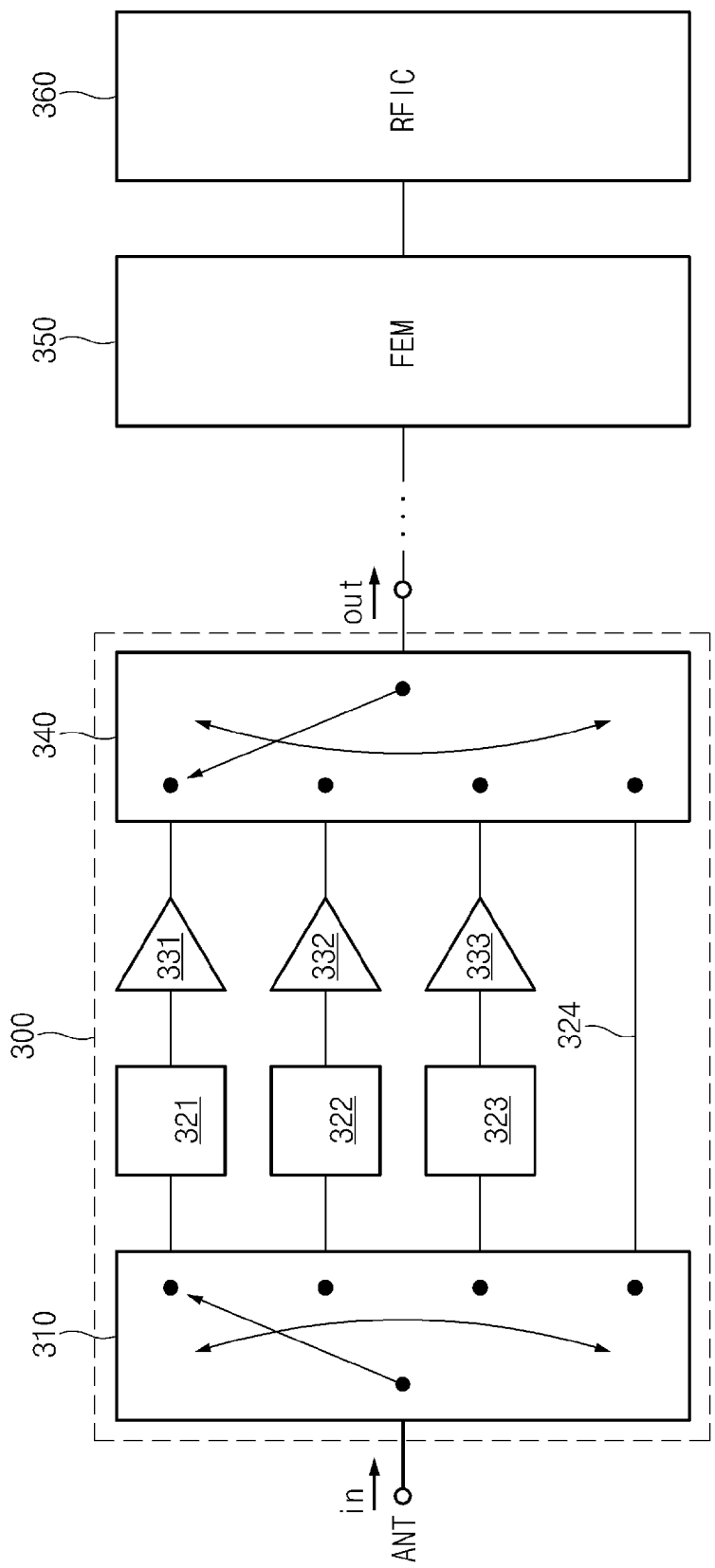
FIG. 3 illustrates an amplifying module and other elements connected thereto according to various embodiments of the present disclosure.

FIG. 3 illustrates an amplifying module and other elements connected thereto according to various embodiments of the present disclosure.

Referring now to FIG. 3, an amplifying module 300 may include a first switch 310, filters 321, 322, and 323, amplifiers 331, 332, and 333, and a second switch 340. Furthermore, a bypass path 324 for bypassing the amplifiers 321, 322, 323 and providing a path from the first switch 310 to the second switch 340 for an input signal without amplification. An output terminal of the amplifying module 300 may be connected to an FEM 350 through a single wiring, and the FEM 350 may be connected to an RFIC 360 (e.g., a transceiver). Descriptions that are similar or correspond to or overlap with the above descriptions may not be provided below and no adverse inferences should be taken with regard to the written description and enablement requirements.

The amplifying module 300 of FIG. 3 may include BPFs for filtering signals of three LTE bands. For example, the filters 321, 322 and 323 may filter signals of B3, B7 and B20 bands respectively. Each filter may be connected to an LNA suitable for each frequency band.

In various embodiments of the present disclosure, the FEM 350 may be able to process signals in addition to the signals of the LTE bands. For example, the FEM 350 may process signals of B1, B5 and B8 bands in addition to the B3, B7 and B20 bands. In this case, the amplifying module 300 may allow the first switch 310 to select the bypass path 324 (and may allow the second switch 340 to select the bypass path 324 at the same time), so as to transfer an antenna signal to the FEM 350. The FEM 350 may select a signal of a frequency band unable to be processed by the amplifying module 300 and may provide the signal to the RFIC 360. In various embodiments of the present disclosure, an LNA (not shown) may be added to the bypass path 324 in consideration of signal loss and a size of an LNA that may be included in the amplifying module 300.

In various embodiments of the present disclosure, the first switch 310 and the second switch 340 and a switch included in the FEM 350 may interwork with each other. For example, in the case where the filter 321 is a BPF for selectively filtering a signal of the B3 band and the electronic device transmits/receives a signal of the B3 band, the first switch 310 and the second switch 340 and the switch (not shown) included in the FEM 350 may establish a path including the filter 321 from an antenna stage to the RFIC. If the electronic device transmits/receives a signal of the B7 band corresponding to the filter 322, the first switch 310 and the second switch 340 and the switch (not shown) included in the FEM 350 may establish a path including the filter 322 from the antenna stage to the RFIC. If the first switch 310 and the second switch 340 select the bypass path 324, the switch included in the FEM 350 may select an arbitrary path for transferring a signal of a frequency band transmitted/received by the electronic device.

As described above, a diversity amplifying module which has one input terminal and one output terminal and passes an antenna signal input through the input terminal towards the output terminal according to various embodiments of the present disclosure, may include a first switch connected to the input terminal, a plurality of filters selectable by the first switch, a plurality of amplifiers respectively connected to the plurality of filters and amplifying a signal that has passed through the filters, and a second switch for connecting the amplified signal to the output terminal.

According to various embodiments of the present disclosure, the first switch and the second switch may interwork with each other.

According to various embodiments of the present disclosure, the output terminal may be connected to an FEM through a single path.

According to various embodiments of the present disclosure, the first switch may further include a path for bypassing the antenna signal to the second switch.

According to various embodiments of the present disclosure, the amplifier may include an LNA.

According to various embodiments of the present disclosure, each filter may pass a signal of a frequency band corresponding to at least one band of an LTE network.

Figure 4:
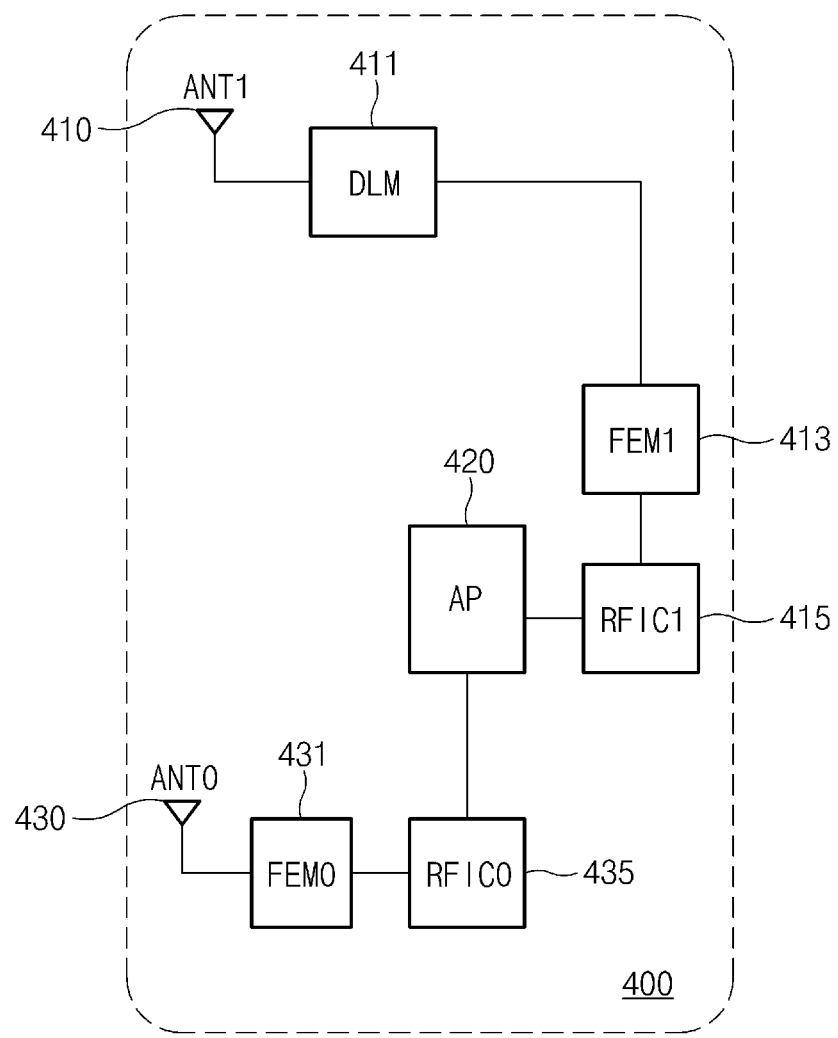
FIG. 4 illustrates an electronic device according to various embodiments of the present disclosure.

FIG. 4 illustrates an electronic device according to various embodiments of the present disclosure.

Referring now to FIG. 4, an electronic device 400 may include a first antenna (ANT 0) 430, and a first FEM (FEM1) 431 and a first RFIC 435 sequentially connected to the first antenna 430. Furthermore, the electronic device 400 may include a second antenna (ANT 1) 410 and a Diversity LNA Module (DLM) 411, a second FEM 413, and a second RFIC 415 sequentially connected to the second antenna 410. The first RFIC 435 and the second RFIC 415 may be construed as a first transceiver and a second transceiver respectively. The DLM 411 may correspond to the above-mentioned amplifying modules (e.g., the amplifying modules 110, 200 and 300). Therefore, the DLM 411 may be connected to the second FEM 413 through a single wiring.

The electronic device 400 may further include at least one processor such as an application processor (AP) 420. The AP 420 may be integrated with a communication processor (CP), or a separate CP (not shown) may be included in the electronic device 400. The AP 420 may communicate with and control the first RFIC 435 and the second RFIC 415. The AP 420 may control the DLM 411 and the second FEM 413 so that switches included therein interwork with each other.

In various embodiments of the present disclosure, a function performed by the AP 420 may be substituted with a function performed by the CP.

In various embodiments of the present disclosure, the first antenna 430 (ANT0) may be a main antenna of the electronic device 400. The second antenna 410 (ANT1), which is a sub-antenna, may operate as a diversity antenna of the first antenna 430. The AP 420 may obtain a reception signal of the first antenna 430 and a diversity reception signal of the second antenna 410 from the first RFIC 435 and the second RFIC 415 respectively so that data throughput may be maximally obtained.

In various embodiments of the present disclosure, the first antenna 430, the first FEM 431, and the first RFIC 435 may be arranged on a first PCB (e.g., a lower PCB) (not shown). For example, the second antenna 410, the DLM 411, the second FEM 413, and the second RFIC 415 may be arranged on a second PCB (not shown) differentiated from the first PCB. The first and second PCBs may be connected to each other by a cable or the like. In this case, the processor may be disposed on the second PCB. However, various embodiments of the present disclosure are not limited to the aforementioned arrangement. For example, one PCB alone or at least three PCBs may exist, and the AP 420 may be disposed on an appropriate PCB.

Figure 5:
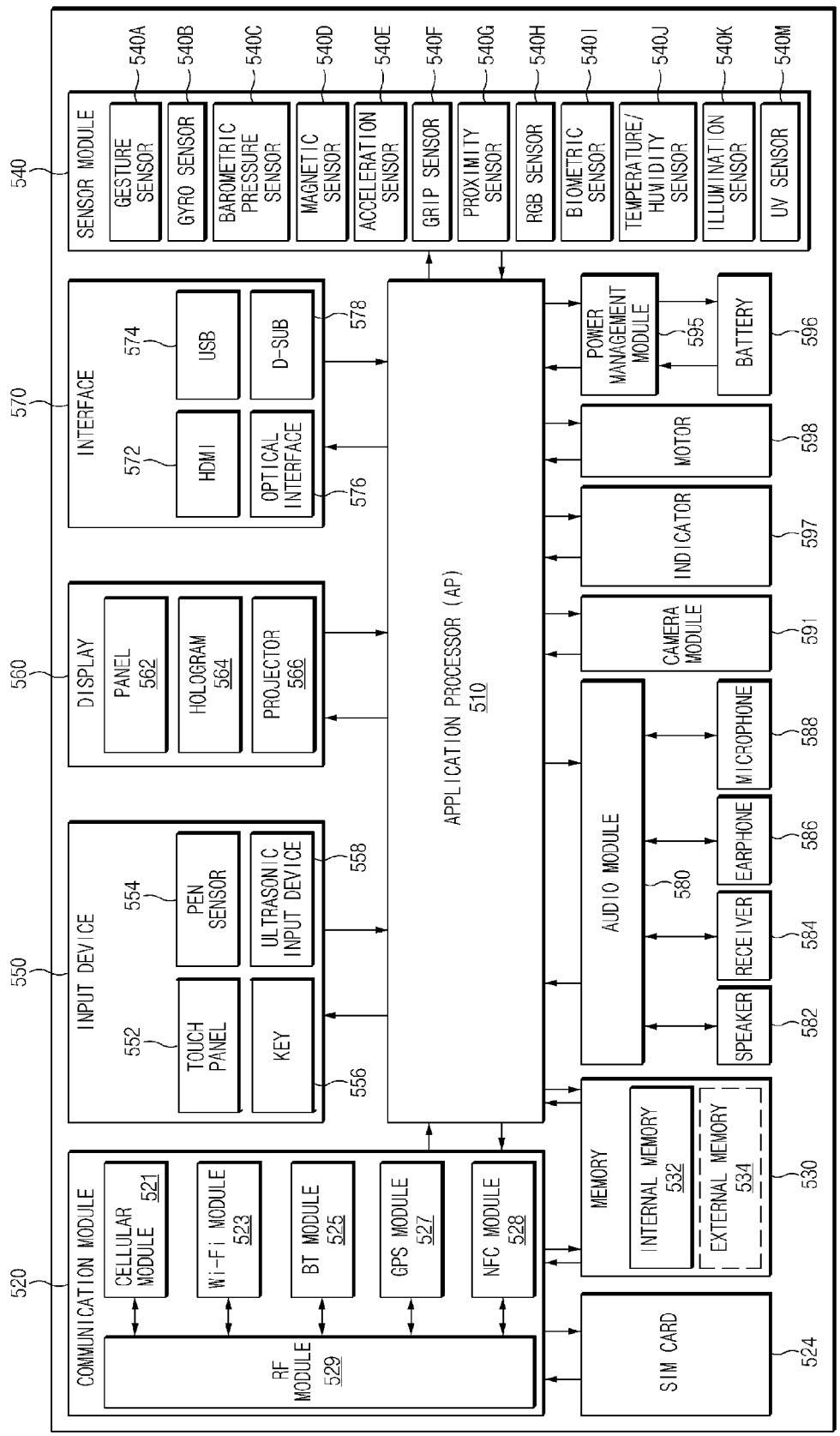
FIG. 5 is a conceptual diagram illustrating a hardware configuration of an electronic device according to various embodiments of the present disclosure.

FIG. 5 is a conceptual diagram illustrating a hardware configuration of an electronic device according to various embodiments of the present disclosure.

The electronic device 500 may constitute, for example, a part or the entirety of the electronic device 10 illustrated in FIG. 1.

Referring now to FIG. 5, the electronic device 500 may include at least one application processor (AP) 510, a communication module 520, a subscriber identification module (SIM) card 524, a non-transitory memory 530, a sensor module 540, an input device 550, a display 560, an interface 570, an audio module 580, a camera module 591, a power management module 595, interface that connects to a battery 596, an indicator 597, and a motor 598. The electronic device may have fewer or a greater number of components than discussed herein above.

The AP 510 may run an operating system or an application program so as to control a plurality of hardware or software elements connected to the AP 510, and may process various data including multimedia data and may perform an operation thereon. The AP 510 may be implemented with, for example, a system on chip (SoC). According to an embodiment of the present disclosure, the AP 510 may further include a graphic processing unit (GPU) (not shown).

The communication module 520 may perform data transmission/reception for communication between the electronic device 500 (e.g., the electronic device 10) and other electronic devices connected thereto through a network. According to an embodiment of the present disclosure, the communication module 520 may include a cellular module 521, a Wi-Fi module 523, a BT module 525, a GPS module 527, an NFC module 528, and a radio frequency (RF) module 529, just to mention some non-limiting possibilities.

The cellular module 521 may provide a voice call service, a video call service, a text message service, or an Internet service through a telecommunications network (e.g., an LTE, LTE-A, CDMA, WCDMA, UMTS, WiBro or GSM network). Furthermore, the cellular module 521 may identify and authenticate electronic devices in the telecommunications network using, for example, a subscriber identification module (e.g., the SIM card 524). According to an embodiment of the present disclosure, the cellular module 521 may perform at least a part of functions provided by the AP 510. For example, the cellular module 521 may perform at least a part of a multimedia control function.

According to an embodiment of the present disclosure, the cellular module 521 may include at least one communication processor (CP). The cellular module 521 may be implemented with, for example, an SoC. Although FIG. 5 illustrates that the cellular module 521 (e.g., a communication processor), the non-transitory memory 530, and the power management module 595 are separated from the AP 510, the AP 510 may include at least a part of the foregoing elements (e.g., the cellular module 521), according to an embodiment of the present disclosure.

According to an embodiment of the present disclosure, the AP 510 or the cellular module 521 (e.g., a communication processor) may load, on a volatile memory, a command or data received from nonvolatile memories connected to the AP 510 and the cellular module 521 respectively or at least one of other elements, so as to process the command or data. Furthermore, the AP 510 or the cellular module 521 may store, in the nonvolatile memory, data received from or generated by at least one of the other elements.

Each of the Wi-Fi module 523, the BT module 525, the GPS module 527, and the NFC module 528 may include, for example, a processor for processing data transmitted/received through the modules. FIG. 5 illustrates that the cellular module 521, the Wi-Fi module 523, the BT module 525, the GPS module 527, and the NFC module 528 are separate blocks. However, according to an embodiment of the present disclosure, at least a part (e.g., two or more) of the cellular module 521, the Wi-Fi module 523, the BT module 525, the GPS module 527, and the NFC module 528 may be included in a single integrated chip (IC) or IC package. For example, at least a part of the processors corresponding to the cellular module 521, the Wi-Fi module 523, the BT module 525, the GPS module 527, and the NFC module 528 respectively (e.g., a communication processor corresponding to the cellular module 521 and a Wi-Fi processor corresponding to the Wi-Fi module 523) may be implemented with a single SoC.

The RF module 529 may transmit/receive data, for example, may transmit/receive RF signals. Although not illustrated, for example, a transceiver, a power amp module (PAM), a frequency filter or a low noise amplifier (LNA) may be included in the RF module 529. Furthermore, the RF module 529 may further include a component such as a conductor or a wire for transmitting/receiving free-space electromagnetic waves in a wireless communication system. FIG. 5 illustrates that the cellular module 521, the Wi-Fi module 523, the BT module 525, the GPS module 527, and the NFC module 528 share the single RF module 529. However, according to an embodiment of the present disclosure, at least one of the cellular module 521, the Wi-Fi module 523, the BT module 525, the GPS module 527, or the NFC module 528 may transmit/receive RF signals through an additional RF module.

The SIM card 524 may include a subscriber identification module, and may be inserted into a slot formed at a specific portion of the electronic device. The SIM card 524 may include unique identification information (e.g., an integrated circuit card identifier (ICCID)) or subscriber information (e.g., international mobile subscriber identity (IMSI)).

The non-transitory memory 530 may include an internal memory 532 or an external memory 534. The internal memory 532 may include at least one of a volatile memory (e.g., a dynamic RAM (DRAM), a static RAM (SRAM), a synchronous dynamic RAM (SDRAM), or the like) or a nonvolatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a NAND flash memory, a NOR flash memory, or the like).

According to an embodiment of the present disclosure, the internal memory 532 may be a solid state drive (SSD). The external memory 534 may include a flash drive, for example, compact flash (CF), secure digital (SD), micro secure digital (Micro-SD), mini secure digital (Mini-SD), extreme digital (xD), a memory stick, or the like, just to name some non-limiting possibilities. The external memory 534 may be functionally connected to the electronic device 500 through various interfaces. According to an embodiment of the present disclosure, the electronic device 500 may further include a storage device (or a storage medium) such as a hard drive.

The sensor module 540 may measure physical quantity or detect an operation state of the electronic device 500 so as to convert measured or detected information into an electrical signal. The sensor module 540 may include, for example, at least one of a gesture sensor 540A, a gyro sensor 540B, a barometric pressure sensor 540C, a magnetic sensor 540D, an acceleration sensor 540E, a grip sensor 540F, a proximity sensor 540G, a color sensor 540H (e.g., a red/green/blue (RGB) sensor), a biometric sensor 540I, a temperature/humidity sensor 540J, an illumination sensor 540K, or an ultraviolet (UV) sensor 540M.

Additionally or alternatively, the sensor module 540 may include, for example, (not shown) an olfactory sensor (E-nose sensor), an electromyography (EMG) sensor, an electroencephalogram (EEG) sensor, an electrocardiogram (ECG) sensor, an infrared (IR) sensor, an iris recognition sensor, or a fingerprint sensor. The sensor module 540 may further include a control circuit for controlling at least one sensor included therein.

The input device 550 may include a touch panel 552, a (digital) pen sensor 554, a key 556, or an ultrasonic input device 558. The touch panel 552 may recognize a touch input using at least one of capacitive, resistive, infrared, and ultraviolet sensing methods. The touch panel 552 may further include a control circuit. In the case of using the capacitive sensing method, a physical contact recognition or proximity recognition is allowed. The touch panel 552 may further include a tactile layer. In this case, the touch panel 552 may provide tactile reaction to a user.

The (digital) pen sensor 554 may be implemented in a similar or a same manner as the method of receiving a touch input of a user or may be implemented using an additional sheet for recognition. The key 556 may include, for example, a physical button, an optical button, or a keypad. The ultrasonic input device 558, which is an input device for generating an ultrasonic signal, may enable the electronic device 500 to sense a sound wave through a microphone (e.g., a microphone 588) so as to identify data, wherein the ultrasonic input device 558 is capable of wireless recognition. According to an embodiment of the present disclosure, the electronic device 500 may use the communication module 520 so as to receive a user input from an external device (e.g., a computer or a server) connected to the communication module 520.

The display 560 may include a panel 562, a hologram device 564, or a projector 566. The panel 562 may be, for example, a liquid crystal display (LCD), an active-matrix organic light-emitting diode (AM-OLED) display, or the like. The panel 562 may be, for example, flexible, transparent or wearable. The panel 562 and the touch panel 552 may be integrated into a single module. The hologram device 564 may display a stereoscopic image in a space using a light interference phenomenon. The projector 566 may project light onto a screen so as to display an image. The screen may be disposed inside or outside of the electronic device 500. According to an embodiment of the present disclosure, the display 560 may further include a control circuit for controlling the panel 562, the hologram device 564, or the projector 566.

The interface 570 may include, for example, a high definition multimedia interface (HDMI) 572, a universal serial bus (USB) 574, an optical interface 576, or a D-sub-miniature (D-sub) 578. Additionally or alternatively, the interface 570 may include, for example, a mobile high-definition link (MHL) interface, a secure digital (SD) card/multi-media card (MMC) interface, or an infrared data association (IrDA) interface.

The audio module 580 may convert a sound into an electrical signal or vice versa. The audio module 580 may process sound information input or output through a speaker 582, a receiver 584, an earphone 586, or the microphone 588.

According to an embodiment of the present disclosure, the camera module 591, which permits shooting of a still image or a video, may include at least one image sensor (e.g., a front sensor or a rear sensor), a lens (not shown), an image signal processor (ISP) (not shown), or a flash (e.g., an LED or a xenon lamp) (not shown).

The power management module 595 may manage power of the electronic device 500. Although not illustrated, a power management integrated circuit (PMIC), a charger integrated circuit (IC), or a battery or fuel gauge may be included in the power management module 595.

The PMIC may be mounted on an integrated circuit or an SoC semiconductor. A charging method may be classified into a wired charging method and a wireless charging method. The charger IC may charge a battery, and may prevent an overvoltage or an overcurrent from being introduced from a charger. According to an embodiment of the present disclosure, the charger IC may include a charger IC for at least one of the wired charging method and the wireless charging method. The wireless charging method may include, for example, a magnetic resonance method, a magnetic induction method, an electromagnetic method, or the like, and may include an additional circuit, for example, a coil loop, a resonant circuit, a rectifier, or the like.

The battery gauge may measure, for example, a remaining capacity of the battery 596 and a voltage, current or temperature thereof while the battery is being charged. The battery 596 may store or generate electricity, and may supply power to the electronic device 500 using the stored or generated electricity. The battery 596 may include, for example, a rechargeable battery or a solar battery.

The indicator 597 may display a specific state of the electronic device 500 or a part thereof (e.g., the AP 510), such as a booting state, a message state, a charging state, or the like. The motor 598 may convert an electrical signal into a mechanical vibration. Although not illustrated, a processing device (e.g., a GPU) for supporting a mobile TV may be included in the electronic device 500. The processing device for supporting a mobile TV may process media data according to the standards of digital multimedia broadcasting (DMB), digital video broadcasting (DVB), MediaFLO™, or the like.

Each of the above-mentioned elements of the electronic device according to various embodiments of the present disclosure may be configured with one or more components, and the names of the elements may be changed according to the type of the electronic device. The electronic device according to various embodiments of the present disclosure may include at least one of the above-mentioned elements, and some elements may be omitted or other additional elements may be added. Furthermore, some of the elements of the electronic device according to various embodiments of the present disclosure may be combined with each other so as to form one entity, so that the functions of the elements may be performed in the same manner as before the combination.

As described above, according to various embodiments of the present disclosure, an electronic device according to an embodiment of the present disclosure may include a first antenna and a second antenna, a first FEM and a first transceiver connected to the first antenna, a second FEM and a second transceiver connected to the second antenna, a processor connected to the first transceiver and the second transceiver, and an amplifying module disposed between the second antenna and the second FEM, wherein the amplifying module may be connected to the second transceiver through a single path.

According to various embodiments of the present disclosure, the amplifying module may include a first switch connected to the second antenna, a plurality of filters selectable by the first switch, amplifiers respectively connected to the plurality of filters and amplifying a signal that has passed through the filters, and a second switch for connecting the amplified signal to the single path.

According to various embodiments of the present disclosure, the first antenna may operate, for example, as a main antenna, and the second antenna may operate as a diversity antenna.

According to various embodiments of the present disclosure, the processor may operate the first switch and the second switch so that the first switch and the second switch interwork with each other.

According to various embodiments of the present disclosure, the processor may operate the first switch and the second switch and a switch included in the second FEM so that the first switch and the second switch and the switch included in the second FEM interwork with each other.

According to various embodiments of the present disclosure, the first antenna, the first FEM, and the first transceiver may be arranged on a first PCB, the second antenna, the amplifying module, the second FEM, and the second transceiver may be arranged on a second PCB, and the first PCB may be connected to the second PCB by a cable or other suitable electrical connection.

According to various embodiments of the present disclosure, the processor may be disposed on the second PCB.

According to various embodiments of the present disclosure, the plurality of filters may include filters for passing signals corresponding to different frequency bands, respectively. It is also within the spirit of the disclosure that filters with variable operational frequencies can be used.

According to various embodiments of the present disclosure, the amplifying module may further include a path for bypassing signals of the second antenna, wherein a signal corresponding to at least a portion of frequency bands, among the bypassed signals of the second antenna, may be filtered by the second FEM.

The apparatuses and methods of the disclosure can be implemented in hardware, and in part as firmware or as machine executable computer code in conjunction with hardware that is stored on a non-transitory machine readable medium such as a CD ROM, a RAM, a hard disk, or a magneto-optical disk, diskette, thumbnail drive computer code downloaded over a network originally stored on a remote recording medium or a non-transitory machine readable medium and stored on a local non-transitory recording medium for execution by hardware such as at least one processor having integrated circuitry configured for operation, so that the methods described herein are loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive machine executable code or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor", "microprocessor" "controller", or "control unit" constitute hardware in the claimed disclosure that contain circuitry that is configured for operation. Under the broadest reasonable interpretation, the appended claims constitute statutory subject matter in compliance with 35 U.S.C. §101 and none of the elements are software per se.

The definition of the terms "unit" or "module" as referred to herein are to be understood as constituting hardware circuitry such as a CCD, CMOS, SoC, AISC, FPGA, a processor or microprocessor (a controller) configured for a certain desired functionality, or a communication module containing hardware such as transmitter, receiver or transceiver, or a non-transitory medium comprising machine executable code that is loaded into and executed by hardware for operation, in accordance with statutory subject matter under 35 U.S.C. §101 and do not constitute software per se. In addition, the controllers shown herein are hardware that are comprised of components, for example, a processor or microprocessor configured for operation by the algorithms shown in the flowcharts and described herein.

The term "module" used herein may represent, for example, a unit including one or more combinations of hardware, software and firmware. The term "module" may be interchangeably used with the terms such as, for example, "component" and "circuit". The "module" may be a minimum unit of an integrated component or may be a part thereof. The "module" may be a minimum unit for performing one or more functions or a part thereof. The "module" may be implemented mechanically or electronically. According to various embodiments of the present disclosure, at least a part of devices (e.g., modules or functions thereof) or methods (e.g., operations) according to various embodiments of the present disclosure may be implemented as instructions stored in a computer-readable storage non-transitory medium in the form of a programming module. In the case where the instructions are performed by at least one processor (e.g., the processor 120), the at least one processor may perform functions corresponding to the instructions. The computer-readable storage medium may be, for example, the memory 130. At least a part of the programming module may be implemented (e.g., executed) by the processor 120. At least a part of the programming module may include, for example, a module, a program, a routine, sets of instructions, or a process for performing at least one function.

The computer-readable storage medium may include magnetic media such as a hard disk, diskette, a floppy disk, and a magnetic tape, optical media such as a compact disk ROM (CD-ROM) and a digital versatile disc (DVD), magneto-optical media such as a floptical disk, and a hardware device configured to store and execute program instructions (e.g., a programming module), such as a ROM, a RAM, and a flash memory, just to name some possible examples. The program instructions may include machine language codes generated by compilers and high-level language codes that can be executed by computers using interpreters. The above-mentioned hardware may be configured to be operated as one or more software modules for performing operations of various embodiments of the present disclosure and vice versa.

The module or programming module according to various embodiments of the present disclosure may include at least one of the above-mentioned elements, or some elements may be omitted or other additional elements may be added. Operations performed by the module, the programming module or the other elements may be performed in a sequential, parallel, iterative or heuristic way. Furthermore, some operations may be performed in another order or may be omitted, or other operations may be added.

According to various embodiments of the present disclosure, a wiring structure having a plurality of paths on a PCB is replaced with a wiring structure having a single path using an amplifying module having a single input-single output structure, so that the efficiency in design and PCB space utilization may be improved.

Furthermore, according to various embodiments of the present disclosure, an amplifying module that is not dependent on a difference in manufacturer/product of a transceiver or an FEM is provided, thereby enabling provision of a DLM that may be used regardless of an RFIC structure or a communication support band of an electronic device or an implementation solution.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. An amplifying module having one input terminal and one output terminal and providing a signal path for an antenna signal input via the input terminal and output via the output terminal, comprising:
   a first switch electrically connected to the input terminal;
   a plurality of filters selectable for electrical connection by the first switch;
   a plurality of amplifiers electrically connected to the plurality of filters, respectively, and each one amplifier is configured to amplify a signal output by a respective one of the plurality of filters;
   a second switch that is electrically connected to the output terminal and that selectively electrically connects to one of the plurality of amplifiers to provide a path for the amplified signal to the output terminal; and
   a bypass path that bypasses the plurality of amplifiers and selectable by the first switch to provide a bypass for the antenna signal from the first switch to the second switch without amplification by one of the plurality of amplifiers.

2. The amplifying module of claim 1, wherein the first switch and second switch interwork with each other.

3. The amplifying module of claim 1, wherein the output terminal is connected to a front end module (FEM) through a single path.

4. The amplifying module of claim 1, further comprising, a Low Noise Amplifier (LNA) arranged in the bypass path between the first switch and the second switch.

5. The amplifying module of claim 1, wherein the bypass path provides a path for the antenna signal from the first switch to the output terminal via the second switch and to a front end module (FEM) connected to the output terminal.

6. The amplifying module of claim 1, wherein at least one amplifier of the plurality of amplifiers comprises a low noise amplifier (LNA).

7. The amplifying module of claim 1, wherein each of the filters passes a signal of a frequency band corresponding to at least one band of a long-term evolution (LTE) network.

8. An electronic device comprising:
- a first antenna and a second antenna;
- a first front end module (FEM) and a first transceiver connected to the first antenna;
- a second FEM and a second transceiver connected to the second antenna;
- at least one processor connected to the first transceiver and the second transceiver; and
- an amplifying module disposed between the second antenna and the second FEM,
- wherein the amplifying module is electrically connected to the second transceiver through a single path.

9. The electronic device of claim 8, wherein the amplifying module comprises:
- a first switch connected to the second antenna;
- a plurality of filters selectable by the first switch;
- a plurality of amplifiers respectively connected to the plurality of filters and amplifying a signal passing through the filters; and
- a second switch for connecting the amplified signal to the single path.

10. The electronic device of claim 9, wherein the at least one processor controls operation of the first switch and the second switch so that the first switch and the second switch interwork with each other.

11. The electronic device of claim 9, wherein the at least one processor controls operation of the first switch, the second switch and another switch included in the second FEM so that the first switch, the second switch and the another switch included in the second FEM interwork with each other.

12. The electronic device of claim 9, wherein the plurality of filters comprise filters for passing signals corresponding to different frequency bands respectively.

13. The electronic device of claim 9, wherein the amplifying module further comprises a bypass path to the second FEM for signals of the second antenna, and
- wherein a signal corresponding to at least a portion of frequency bands, among the signals of the second antenna is provided to the second FEM for filtering via the bypass path.

14. The electronic device according to claim 8, wherein the amplifying module comprises a Diversity LAN Module (DLM).

15. The electronic device of claim 8, wherein the first antenna operates as a main antenna, and the second antenna operates as a diversity antenna.

16. The electronic device of claim 8,
- wherein the first antenna, the first FEM, and the first transceiver are arranged on a first printed circuit board (PCB),
- wherein the second antenna, the amplifying module, the second FEM, and the second transceiver are arranged on a second PCB, and
- wherein the first PCB is electrically connected to the second PCB.

17. The electronic device of claim 16, wherein the at least one processor is disposed on the second PCB.

* * * * *